(12) United States Patent
Han et al.

(10) Patent No.: US 10,790,026 B2
(45) Date of Patent: Sep. 29, 2020

(54) NON-VOLATILE MEMORY DEVICE AND SYSTEM CAPABLE OF EXECUTING OPERATIONS ASYNCHRONOUSLY, AND OPERATION EXECUTION METHOD OF THE SAME

(71) Applicant: SAMSUNG ELECTRONICS CO., LTD., Suwon-si, Gyeonggi-Do (KR)

(72) Inventors: Il-Su Han, Incheon (KR); Sung-Joon Kim, Seoul (KR); Jong-Hwa Kim, Seoul (KR); Da-Hee Jeong, Cheongju-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/174,839

(22) Filed: Oct. 30, 2018

(65) Prior Publication Data
US 2019/0206494 A1   Jul. 4, 2019

(30) Foreign Application Priority Data
Dec. 28, 2017   (KR) .................. 10-2017-0181828

(51) Int. Cl.
*G11C 16/10* (2006.01)
*G11C 16/08* (2006.01)
(Continued)

(52) U.S. Cl.
CPC .............. *G11C 16/10* (2013.01); *G06F 12/00* (2013.01); *G06F 13/00* (2013.01); *G11C 7/1063* (2013.01); *G11C 7/1066* (2013.01); *G11C 7/1093* (2013.01); *G11C 16/08* (2013.01); *G11C 2216/14* (2013.01)

(58) Field of Classification Search
CPC ....... G11C 16/10; G11C 16/08; G11C 7/1093; G11C 7/1066; G11C 2216/14; G11C 7/1063; G06F 12/00; G06F 12/1009; G06F 13/00
See application file for complete search history.

(56) References Cited

U.S. PATENT DOCUMENTS 7,679,133 B2   3/2010   Son et al.
8,553,466 B2   10/2013   Han et al.
(Continued)

*Primary Examiner* — David Lam
(74) *Attorney, Agent, or Firm* — F. Chau & Associates, LLC

(57) ABSTRACT

A non-volatile memory device includes a non-volatile memory cell array, an input/output pad unit, and a peripheral circuit. The non-volatile memory device executes an operation requested by a controller. The input/output pad component provides a path through which a command and data related to the operation requested by the controller are input to the non-volatile memory device, and through which a result of execution of the requested operation is output to the controller. The peripheral circuit is configured to be loaded with a plurality of commands provided by the controller, to temporarily store program data provided by the controller to be written in the non-volatile memory cell array and data read from the non-volatile memory cell array, to adjust an execution order of the commands asynchronously with the controller based on an internal operation status of the non-volatile memory device, and to execute the commands in the adjusted execution order.

20 Claims, 12 Drawing Sheets

(51) Int. Cl.
  *G11C 7/10*   (2006.01)
  *G06F 12/00*  (2006.01)
  *G06F 13/00*  (2006.01)

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,832,333 B2 | 9/2014 | Morita |
| 9,582,211 B2 | 2/2017 | Ellis et al. |
| 9,626,106 B2 | 4/2017 | Hsu et al. |
| 9,679,658 B2 | 6/2017 | Pelster et al. |
| 9,799,406 B2 * | 10/2017 | Sato .................. G11C 8/08 |
| 2011/0233648 A1 | 9/2011 | Seol et al. |
| 2015/0067291 A1 | 3/2015 | Miyamoto et al. |
| 2015/0378885 A1 * | 12/2015 | Kim ............... G06F 12/0246 |
| | | 711/103 |
| 2016/0163386 A1 | 6/2016 | Hwang et al. |
| 2016/0260698 A1 | 9/2016 | Oh et al. |
| 2016/0291878 A1 * | 10/2016 | Kang ................ G06F 3/0659 |
| 2016/0364345 A1 * | 12/2016 | Jeter ................ G06F 13/161 |
| 2018/0047707 A1 * | 2/2018 | Or-Bach .......... H01L 21/76898 |
| 2019/0278705 A1 * | 9/2019 | Park ............... G06F 12/0246 |

* cited by examiner

FIG. 9

(A) <TABLE OF FIRST TASK STATUS REGISTER> ~294

| | DQ0 | DQ1 | DQ2 | DQ3 | DQ4 | DQ5 | DQ6 | DQ7 |
|---|---|---|---|---|---|---|---|---|
| VALUE | 1 | 1 | 0 | 1 | 1 | 1 | 1 | 1 |
| STATUS | Busy | Busy | Empty | Busy | Busy | Busy | Busy | Busy |

(B) <TABLE OF SECOND TASK STATUS REGISTER> ~354

| | DQ0 | DQ1 | DQ2 | DQ3 | DQ4 | DQ5 | DQ6 | DQ7 |
|---|---|---|---|---|---|---|---|---|
| VALUE | 1 | 1 | 0 | 1 | 1 | 1 | 1 | 1 |
| STATUS | Busy | Busy | Empty | Busy | Busy | Busy | Busy | Busy |

NON-VOLATILE MEMORY DEVICE AND SYSTEM CAPABLE OF EXECUTING OPERATIONS ASYNCHRONOUSLY, AND OPERATION EXECUTION METHOD OF THE SAME

CROSS-REFERENCE TO RELATED APPLICATIONS

This application claims priority under 35 U.S.C. § 119 to Korean Patent Application No. 10-2017-0181828, filed on Dec. 28, 2017, the disclosure of which is incorporated by reference herein in its entirety.

TECHNICAL FIELD

Exemplary embodiments of the inventive concept relate to a semiconductor integrated circuit, and more particularly, to a non-volatile memory device capable of improving performance through asynchronous execution of requests received from a host, and a method for performing an operation thereof.

DISCUSSION OF THE RELATED ART

A semiconductor memory device may be classified as a volatile memory device or a non-volatile memory device depending on whether the stored data is saved or lost when the power supply is interrupted. A non-volatile memory device can maintain the data even if the power is turned off. A representative example of a non-volatile memory device is a flash memory device. A flash memory device is widely used as a large-capacity data storage means for storing programs and data in various electronic devices such as, for example, a computer, a mobile phone, a PDA, a digital camera, a camcorder, a voice recorder, an MP3 player, a personal digital assistant (PDA), a handheld PC, a game machine, a fax machine, a scanner, a printer, etc.

In a computing system, a data storage device may include a non-volatile memory device and a controller. The non-volatile memory device may be located in the lowest layer of the system, and the controller may be located in an upper layer of the non-volatile memory device. The non-volatile memory device may perform operations passively according to commands received from the controller. For example, a conventional flash memory device is only capable of passively performing a program operation, a read operation, and an erase operation in the order as given by the controller. Due to this sequential execution of the operations, idle time frequently occurs between the operations performed in the flash memory device, thereby increasing the execution time of all of the operations, and degrading the performance of the flash memory device and the performance of the computing system employing the flash memory device.

SUMMARY

Exemplary embodiments of the present inventive concept provide a non-volatile memory device capable of efficiently managing the input and output of data, and minimizing (or reducing) idle time in a manner that the data and a plurality of commands provided by an external host or a controller are loaded therein and the execution order of the operations is asynchronously adjusted according to the internal operation status of the non-volatile memory device, as well as a non-volatile memory system including the non-volatile memory device.

Exemplary embodiments of the present inventive concept provide a method of performing operations of a non-volatile memory device that can efficiently manage the input and output of data, and minimize (or reduce) idle time in a manner that the data and a plurality of commands provided by an external host or a controller are loaded in the non-volatile memory device and the execution order of the operations is asynchronously adjusted according to the internal operation status of the non-volatile memory device.

According to an exemplary embodiment of the present inventive concept, a non-volatile memory device includes a non-volatile memory cell array, an input/output pad component, and a peripheral circuit. The non-volatile memory cell array is configured to store data, and the non-volatile memory device executes an operation requested by a controller. The input/output pad component is configured to provide a path through which a command and data related to the operation requested by the controller are input to the non-volatile memory device, and through which a result of execution of the requested operation is output to the controller. The peripheral circuit is configured to be loaded with a plurality of commands provided by the controller, to temporarily store program data provided by the controller to be written in the non-volatile memory cell array and data read from the non-volatile memory cell array, to adjust an execution order of the commands asynchronously with the controller, and to execute the commands in the adjusted execution order.

According to an exemplary embodiment of the present inventive concept, a non-volatile memory system includes a non-volatile memory device, and a controller configured to transmit a request to the non-volatile memory device to execute an operation. The non-volatile memory device includes a non-volatile memory cell array configured to store data, an input/output pad component, and a peripheral circuit. The input/output pad component is configured to provide a path through which a command and data related to the operation requested by the controller are input to the non-volatile memory device, and through which a result of execution of the requested operation is output to the controller. The peripheral circuit is configured to be loaded with a plurality of commands provided by the controller, to temporarily store program data provided by the controller to be written in the non-volatile memory cell array and data read from the non-volatile memory cell array, to adjust an execution order of the commands asynchronously with the controller, and to execute the commands in the adjusted execution order.

According to an exemplary embodiment of the present inventive concept, a method of executing an operation in a non-volatile memory device includes parsing a command provided by a controller through an input/output pad component of the non-volatile memory device. The non-volatile memory device includes a non-volatile memory cell array and a peripheral circuit. The peripheral circuit includes a queue, a data buffer, and a command parser. The method further includes loading the parsed command into the queue, temporarily storing at least one of program data provided by the controller through the input/output pad component, and data read from the non-volatile memory cell array, in a data area of the data buffer, updating a map area of the data buffer with information relating to data stored in the data buffer, adjusting an execution order of a plurality of commands loaded to the queue asynchronously with the controller, and executing the commands loaded to the queue in the adjusted execution order.

Since the non-volatile memory device according to the exemplary embodiments of the present inventive concept includes a queue capable of storing a plurality of commands and a data buffer capable of temporarily storing a large amount of data, the operations instructed by an external host (or the controller) are actively and intelligently controlled using the queue and the data buffer. As a result, the idle time of the non-volatile memory device can be minimized (or reduced), thus, improving performance. In addition, data input and output is efficiently managed between the external host and the non-volatile memory device, thereby improving performance.

BRIEF DESCRIPTION OF THE DRAWINGS

The above and other features of the present inventive concept will become more apparent by describing in detail exemplary embodiments thereof with reference to the accompanying drawings, in which:

FIG. 9 illustrates tables for task status registers provided in an external controller (host) and a non-volatile memory device, respectively, according to an exemplary embodiment of the present inventive concept.

DETAILED DESCRIPTION OF THE EXEMPLARY EMBODIMENTS

Figure 1:
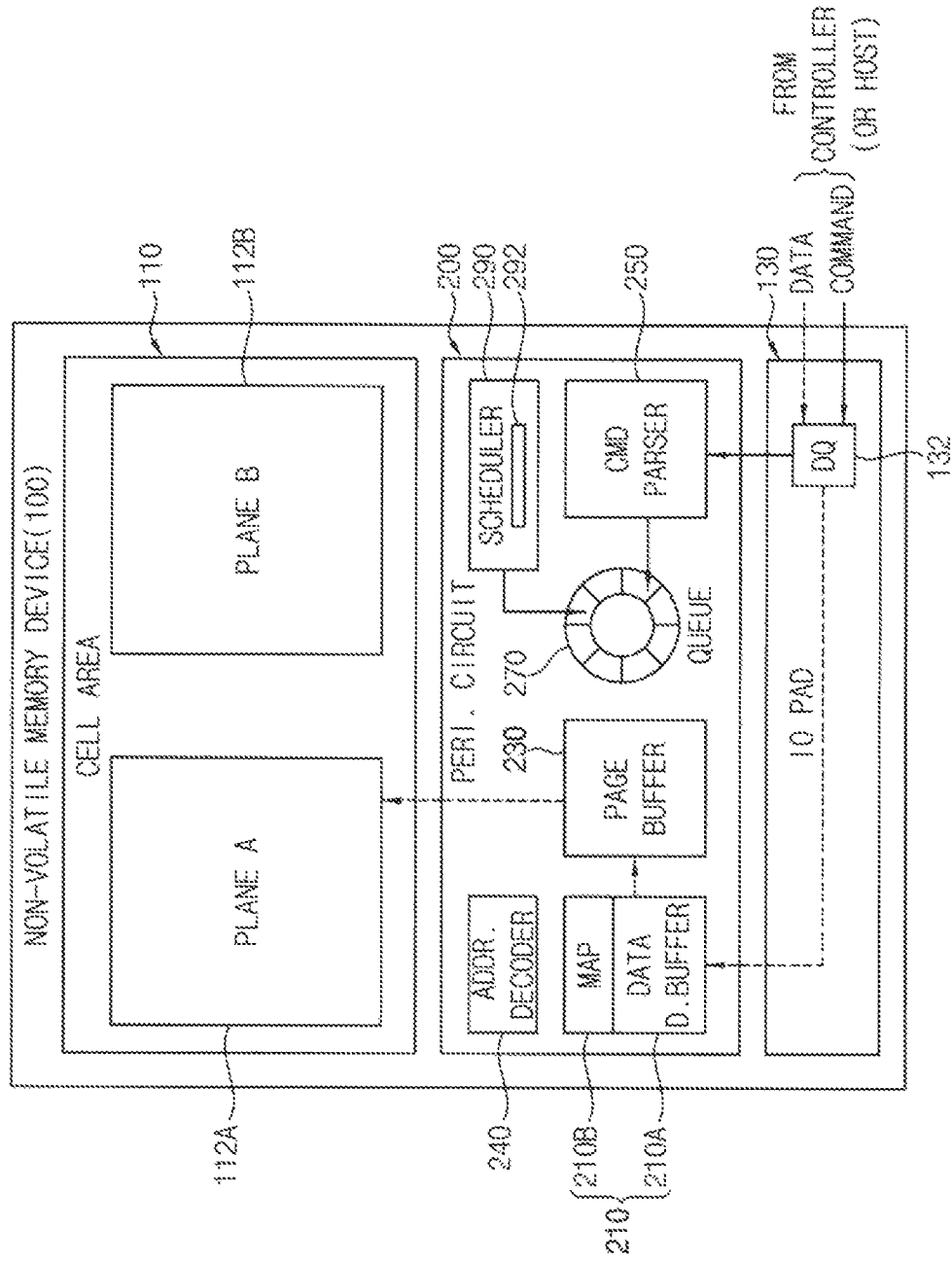
FIG. 1 is a block diagram showing a configuration of a non-volatile memory device according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a block diagram illustrating a schematic configuration of a non-volatile memory device 100 according to an exemplary embodiment of the inventive concept.

Referring to FIG. 1, in an exemplary embodiment, a non-volatile memory device 100 includes a non-volatile memory cell array 110, an input/output (I/O) pad unit 130, and a peripheral circuit 200. The input/output pad unit 130 is a component that includes a plurality of input/output pads that allow data to be transmitted into and out of the non-volatile memory device 100. The non-volatile memory device 100 may perform data read or write operations in response to a data read or write request received from an external host or a controller. Here, the host or the controller may be located outside of the non-volatile memory device 100, and refers to a device that generates and transmits data read and write requests to the non-volatile memory device 100. The controller may perform the role of the external host directly or indirectly. The controller may be regarded as a part or an example of the host. Thus, the controller referred to below may also be regarded as an external host with respect to the non-volatile memory device 100.

The non-volatile memory cell array 110 may be, for example, a recording medium on which data is finally stored, and may include a plurality of non-volatile memory cells capable of holding recorded data regardless of whether power is turned on or off. The plurality of memory cells may be arranged in a matrix form and connected to a plurality of word lines and a plurality of bit lines. The non-volatile memory cells may be in a planar structure in which the entirety is arranged in one plane. Alternatively, the entire non-volatile memory cells may be distributed over a plurality of planes. FIG. 1 illustrates an exemplary embodiment in which all of the non-volatile memory cells (e.g., the entirety of the non-volatile memory cells) are distributed over a first plane 112A and a second plane 112B. The non-volatile memory cell array 110 may be a two-dimensional array (or planar) structure in which the first plane 112A and the second plane 112B are coplanar. Alternatively, the non-volatile memory cell array 110 may be a three-dimensional vertical array structure. The number of planes in which all of the non-volatile memory cells are distributed may be three or more, and the planes may have an upper and lower placement relationship.

According to an exemplary embodiment, the non-volatile memory cells may belong to a NAND flash memory cell array. In other exemplary embodiments, the non-volatile memory cells may be any one of a Phase Change Random Access Memory (PRAM) cell, a Resistance Random Access Memory (RRAM) cell, a Nano Floating Gate Memory (NFGM) cell, a Polymer Random Access Memory (PoRAM) cell, a Magnetic Random Access Memory (MRAM) cell, a Ferroelectric Random Access Memory (FRAM) cell, etc.

The input/output pad unit 130 is a path through which commands and data are transmitted. For example, the input/output pad unit 130 may receive commands (including, for example, addresses, control signals, etc.) and data related to the operations requested by the external host or the external controller, and may output data, addresses, and execution results of the requested operations to the external host or the controller. The input/output pad unit 130 may include a plurality of DQs 132. Input/output pads may be connected to the external host or controller. The command entered to the input/output pad unit 130 may be transmitted to a command parsing unit 250 (also referred to as a command parser 250) or a queue 270. The write data entered to the input/output pad unit 130 may be transferred to a data buffer 210, which will be described in further detail below. The read data stored in the data buffer 210 may be transferred to the external host or the controller via the input/output pad unit 130. For example, the input/output pad unit 130 may serve as an interface for the command parsing unit 250 and the data buffer 210 connected to the external host or the controller.

According to exemplary embodiments of the inventive concept, the peripheral circuit 200 loads a plurality of commands provided by the external host or the external controller onto itself in a manner different from a conventional peripheral circuit, as described in detail below. The peripheral circuit 200 may temporarily store data to be written in the non-volatile memory cell array 110 provided by the controller and data read from the non-volatile memory cell array 110. The peripheral circuit 200 may perform a plurality of commands asynchronously with the controller. For example, the peripheral circuit 200 may perform a plurality of commands in a different order than the order in which the commands are provided by the host or the controller. For example, the execution order of the commands may be adjusted in an order that can minimize (or reduce) the idle time based on the operation status inside the non-volatile memory device 100.

According to an exemplary embodiment, the peripheral circuit 200 includes the data buffer 210, a page buffer 230, the command parsing unit 250, the queue 270, and a scheduler 290.

The page buffer 230 may be connected to the non-volatile memory cell array 110 through a plurality of bit lines. The page buffer unit 230 may include a plurality of page buffers. In an exemplary embodiment, one bit line may be connected to one page buffer. In another exemplary embodiment, two or more bit lines may be coupled to one page buffer. The page buffer 230 may be connected to the data buffer 210. The page buffer 230 may receive program data to be written (or programmed) in the selected page of the non-volatile memory cell array 110 from the data buffer 210 in response to a column address in the program operation, and may temporarily store the program data until the program data is written to the specified address of the non-volatile memory cell array 110. The page buffer 230 may also temporarily store the read data sensed from the selected page of the non-volatile memory cell array 110 until the read data is transferred to the data buffer 210 during the read operation. Thus, the page buffer 230 may operate as a write driver or as a sense amplifier depending on the operation mode of the non-volatile memory device 100. In addition, the page buffer 230 may serve as a temporary storage area in which data can be temporarily stored. The page buffer 230 may have a data storage space equivalent to a page size. The page buffer 230 may be implemented as, for example, a dynamic random access memory (DRAM). In the NAND flash memory, the page size may be, for example, 16K bits.

The command parsing unit 250 may parse a command sequence provided by the external host or the controller through the input/output pad unit 130. The command parsing unit 250 may be connected to the input/output pad unit 130 to receive commands from the external host or the controller. The command parsing unit 250 may access the queue 270, and may deliver the parsed command to the queue 270.

The queue 270 may temporarily load into itself a plurality of commands provided by the external host or the controller via the input/output pad unit 130. The queue 270 may be connected to the command parsing unit 250. Accordingly, the queue 270 can receive the commands through the command parsing unit 250. Alternatively, the queue 270 may be connected (e.g., directly connected) to the input/output pad unit 130. Accordingly, in an exemplary embodiment, the queue 270 can directly receive and store a command sequence provided by the external host or the controller via the input/output pad unit 130 without passing through the command parsing unit 250. The command parsing unit 250 may access the queue 270 and parse the command after the sequence of commands is loaded into the queue 270.

The queue 270 may be implemented as a circular queue. According to an exemplary embodiment, the queue 270 may be implemented as a circular buffer or a circular register. Alternatively, the queue 270 may be implemented as a logic circuit. A depth of the queue 270 may correspond to the number of commands to be loaded. For example, if the depth of the queue 270, that is, the number of storage elements, is eight, eight commands can be stored. By making the depth of the queue 270 deeper, more commands to be executed can be examined, and the execution order for the commands can then be determined. In this case, the queue 270 utilizes more space, but the efficiency of performing the operations of the commands may be increased.

Referring to a comparative example in which a non-volatile memory device synchronously performs commands received from an external host or controller in the provided order, the non-volatile memory device does not include a queue and a data buffer. An idle time may result in the comparative example since the non-volatile memory device performs the commands in the provided order. In contrast, exemplary embodiments of the inventive concept minimize (or reduce) idle time by loading a plurality of commands into the queue 270 and adjusting the execution order of the loaded commands to be asynchronous with the input order of the commands provided by the controller. Thus, according to exemplary embodiments, a storage space for temporarily storing and maintaining a large amount of data related to performing the commands stored in the queue 270, that is, the data buffer 210, is utilized.

The data buffer 210 may be provided between the page buffer 230 and the input/output pad unit 130. The data buffer 210 may be connected to the input/output pad unit 130 for data transfer. The data buffer 210 may temporarily store program data transferred from the external host or the controller through the input/output pad unit 130, and transfer the data to be written into the non-volatile memory cell array 110 to the page buffer 230 to perform the operation of a predetermined command loaded in the queue 270. The data buffer 210 may receive data read from the non-volatile memory cell array 110 from the page buffer 230, temporarily store the data, and then transmit the data to the external host or the controller through the input/output pad unit 130.

The data buffer 210 may include a data area 210A and a map area 210B. The data area 210A is an area for temporarily storing program data and/or read data. The map area 210B is an area for storing a list of data (e.g., storage address, data size, related operation information, etc.) temporarily stored in the data area 210A and information for managing data validity.

According to an exemplary embodiment, since it may be sufficient that the data buffer 210 serves as a temporary data storage space, the data buffer 210 may be implemented as a DRAM having a high speed of data writing and reading. As the data buffer 210 buffers a large amount of data, the performance of the non-volatile memory device 100 may be improved. Therefore, the data buffer 210 may be adjusted to have a storage space of a sufficiently large size so as to exhibit desired performance. In exemplary embodiments, the data buffer 210 has a much larger storage space than that of the page buffer 230.

The data buffer 210 may be provided in the non-volatile memory device 100, but may be provided in a third area other than a region in which existing peripheral circuits are arranged together. In exemplary embodiments, the area of the peripheral circuit 200 refers to an area which includes both the existing peripheral circuit area and the third area. For example, the area of the peripheral circuit 200 in exemplary embodiments of the present disclosure may be defined as an area which corresponds to the remaining area of the non-volatile memory device 100 excluding the area of the non-volatile memory cell array 110 and the area of the input/output pad unit 130.

The scheduler 290 may include a logic circuit that performs a plurality of commands loaded in the queue 270. The logic circuit may adjust the execution order based on the operation status of the non-volatile memory device 100 and/or a predetermined scheduling policy of the non-volatile memory device 100. In exemplary embodiments, the operation status of the non-volatile memory device 100 refers to, for example, the command currently being executed in the non-volatile memory device 100, and commands that are to be subsequently executed in the non-volatile memory device 110. For example, the operation status may refer to the type of command currently being executed, for example, whether the nonvolatile memory device is in an idle state, a read operation, or a program operation, the type of commands that are to be subsequently executed, the expected execution time of each command, etc. The logic circuit may adjust the execution order in accordance with a predetermined scheduling policy of the non-volatile memory device 100. The scheduler 290 may access the queue 270. The scheduler 290 may determine all of the operations that should be carried out in connection with all of the commands loaded in the queue 270. Since the operations of the commands to be performed are known, the scheduler 290 can determine, based on its scheduling policy, the best execution order that will maximize performance. A target point of the scheduling policy is to minimize (or reduce) the idle time of the non-volatile memory device 100, and to maximize (or increase) the efficiency of data input/output management. In exemplary embodiments, the command execution order adjusted by the scheduler 290 is different from the command execution order provided by the external host or the controller. For example, in exemplary embodiments, the scheduler 290 changes the original execution order such that a plurality of commands loaded in the queue 270 are performed without being synchronized with the order provided by the external host or a controller. For example, in exemplary embodiments, the execution order of the commands is adjusted to minimize (or reduce) the idle time, and improve the efficiency of data input/output management. The scheduler 290 may maintain and manage a first task status register (TSR) 292 for managing the status of the queue 270, which will be described in further detail below.

The peripheral circuit 200 may further include an address decoder 240. The address decoder 240 may be connected to the memory cell array 110 through a string select line, a plurality of word lines, and a ground select line. During programming or reading operations to/from the non-volatile memory cell array 110, the address decoder 240 may determine one of the plurality of word lines as a selected word line based on a row address provided from the external controller, and may determine the remaining word lines of the plurality of word lines excluding the selected word line as unselected word lines. The word line voltages required for operation of the non-volatile memory device 100 may be applied to the plurality of word lines via the address decoder 240. The word line voltages may be generated by a voltage generator based on control signals provided from the external controller.

The peripheral circuit 200 may further include other peripheral circuits that are not described above. Examples thereof may include a control circuit configured to control data program (write)/read/erase operations for the memory cell array 110 based on the command and the address, a voltage generating circuit configured to generate word line voltages VWL necessary for the operation of the non-volatile memory device 100 to be supplied to the address decoder 240 based on the power source voltage, etc.

According to exemplary embodiments, the peripheral circuit 200 may be applied to a case in which the non-volatile memory cell array 110 is formed in a two-dimensional structure (or a planar structure) on a substrate planar structure, or a case in which the non-volatile memory cell array 110 is formed in a three-dimensional structure (or a vertical structure) on one substrate. When the non-volatile memory array 110 is the planar structure, the peripheral circuit 200 may be disposed on the same plane as the region of the non-volatile memory array 110. In this case, the limitation on a space that the peripheral circuit 200 can occupy may be relatively large.

Figure 3:
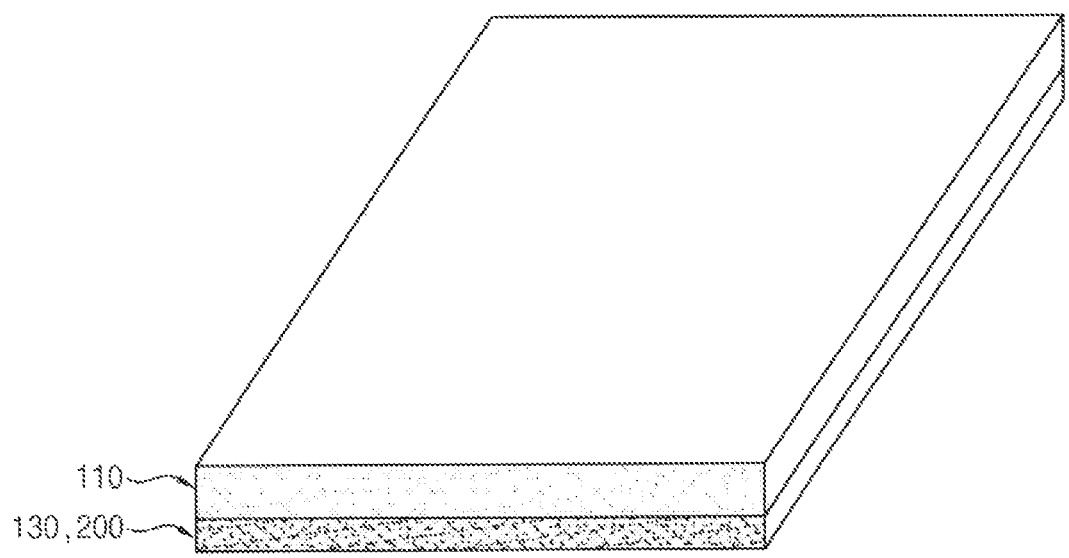
FIG. 3 is a perspective view showing a non-volatile memory device according to an exemplary embodiment of the present inventive concept constructed in a cell over peripheral (COP) structure.

Alternatively, when the non-volatile memory cell array 110 is a vertical structure in which a plurality of layers are stacked in a vertical direction, the peripheral circuit 200 may be arranged in a vertical relationship with the region of the non-volatile memory array 110. For example, in an exemplary embodiment, the non-volatile memory cell array 110 is a vertical structure including a plurality of layers, and the peripheral circuit 200 is physically arranged above or below the vertical structure in a vertical relationship with the non-volatile memory cell array 110. According to an exemplary embodiment, the peripheral circuit 200 may be disposed below a region including the non-volatile memory array cell array 110. For example, the peripheral circuit 200 may be provided in a cell over peripheral (COP) structure. FIG. 3 conceptually illustrates the non-volatile memory device 100 configured in the COP structure. Since the peripheral circuit 200 according to the exemplary embodiments of the present inventive concept further includes new resources such as the data buffer 210 and the queue 270 as compared with a conventional peripheral circuit, a peripheral region wider than the existing peripheral region of a conventional peripheral circuit may be needed. The COP structure may allocate the entire one planar region for the peripheral circuit 200. Thus, since the COP structure can provide a space for accommodating new logic components in the peripheral circuit 200, the COP structure is suitable for implementing the desired performance improvement of exemplary embodiments of the present inventive concept.

Figure 2:
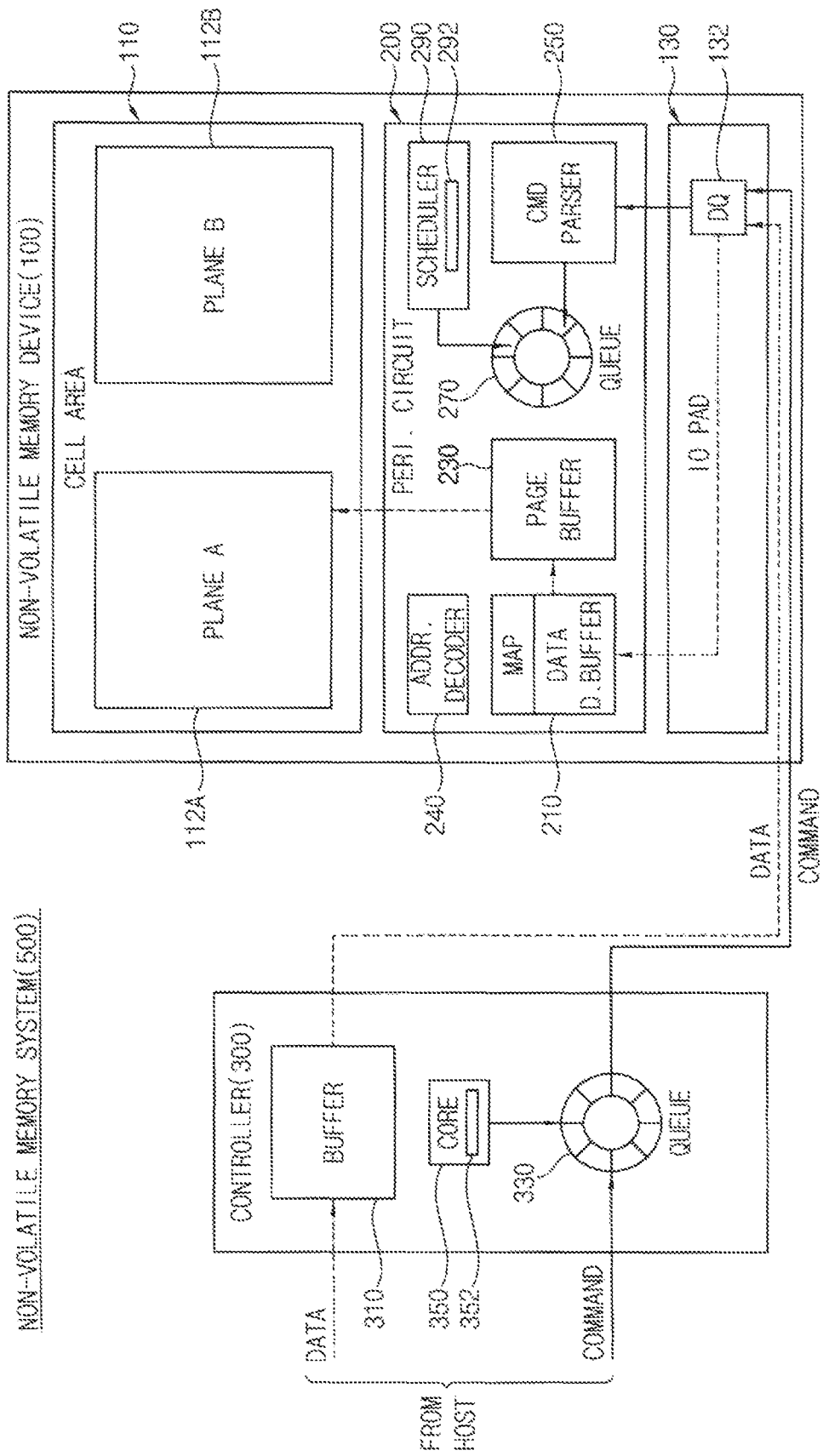
FIG. 2 is a block diagram illustrating a configuration of a non-volatile memory system including a non-volatile memory device according to an exemplary embodiment of the present inventive concept.

FIG. 2 illustrates a configuration of a non-volatile memory system 500 including the non-volatile memory device 100 in accordance with an exemplary embodiment of the present inventive concept.

Referring to FIG. 2, in an exemplary embodiment, the non-volatile memory system 500 further includes, in addition to the above-described non-volatile memory device 100, a controller 300 configured to request the non-volatile memory device 100 to perform a predetermined operation and to perform a control operation to receive a response to the request for the predetermined operation. The predetermined operation may be one requested by the external host. A representative example of the non-volatile memory system 500 may be, but is not limited to, a solid state drive (SSD) including a plurality of non-volatile memory devices, such as, for example, a NAND flash memory.

The controller 300 may be coupled to the non-volatile memory device 100 via a plurality of channels. The controller 300 may include, for example, a buffer 310, a queue 330, and a core logic component 350 (also referred to herein as a core logic circuit 350).

The buffer 310 may temporarily store the program data requested by the external host and the read data transferred from the non-volatile memory device 100. In addition, the buffer 310 may transmit the stored program data to the non-volatile memory device 100 through the DQ 132 according to a command. The buffer 310 may temporarily store data necessary for driving the controller 300. The buffer 310 may be implemented as, for example, a DRAM.

The queue 330 may temporarily store a plurality of commands provided by the external host. According to an exemplary embodiment, the queue 330 may be implemented as a circular queue. The circular queue may be implemented as, for example, a circular buffer, a circular register, or a logic circuit. The depth of the queue 330, that is, the number of storage elements, may correspond to the number of commands to be loaded. According to an exemplary embodiment, the queue 330 may have the same depth as the queue 270 of the non-volatile memory device 100.

The buffer 310 and the queue 330 may be connected to a processor of the external host via a host interface. In addition, the buffer 310 and the queue 330 may be coupled to the non-volatile memory device 100 via a memory interface.

In exemplary embodiments, the core logic component 350 adjusts the order in which the commands stored in the queue 330 are transferred to the non-volatile memory device 100, and sends the commands to the non-volatile memory device 100 in the adjusted order. The order of providing the commands stored in the queue 330 to the non-volatile memory device 100 may be the same as or different from the order in which the commands from the external host are provided to the controller 300. The core logic component 350 may determine an execution order of the commands so as to be processed most efficiently in consideration of, for example, the operation status of the non-volatile memory device 100 including, for example, the type of commands stored in the queue 330, the expected execution time of each command, etc., and/or a predetermined scheduling policy of the non-volatile memory device 100. The execution order of the commands may be determined based on a predetermined policy. The core logic component 350 may cause the commands stored in the queue 330 to be transferred to the non-volatile memory device 100 in the order determined as above. According to an exemplary embodiment, the core logic component 350 may include a second task status register 352 configured to manage the status of the queue 330. The second task status register 352 will be described in further detail below.

The controller 300 may communicate with the non-volatile memory device 100 according to a predetermined interface protocol, as described in further detail below. The non-volatile memory device 100 may perform operations such as, for example, program/read/erase operations, under the control of the controller 300. The non-volatile memory device 100 may perform predetermined operations on a page, block and/or mat basis.

Figure 4:
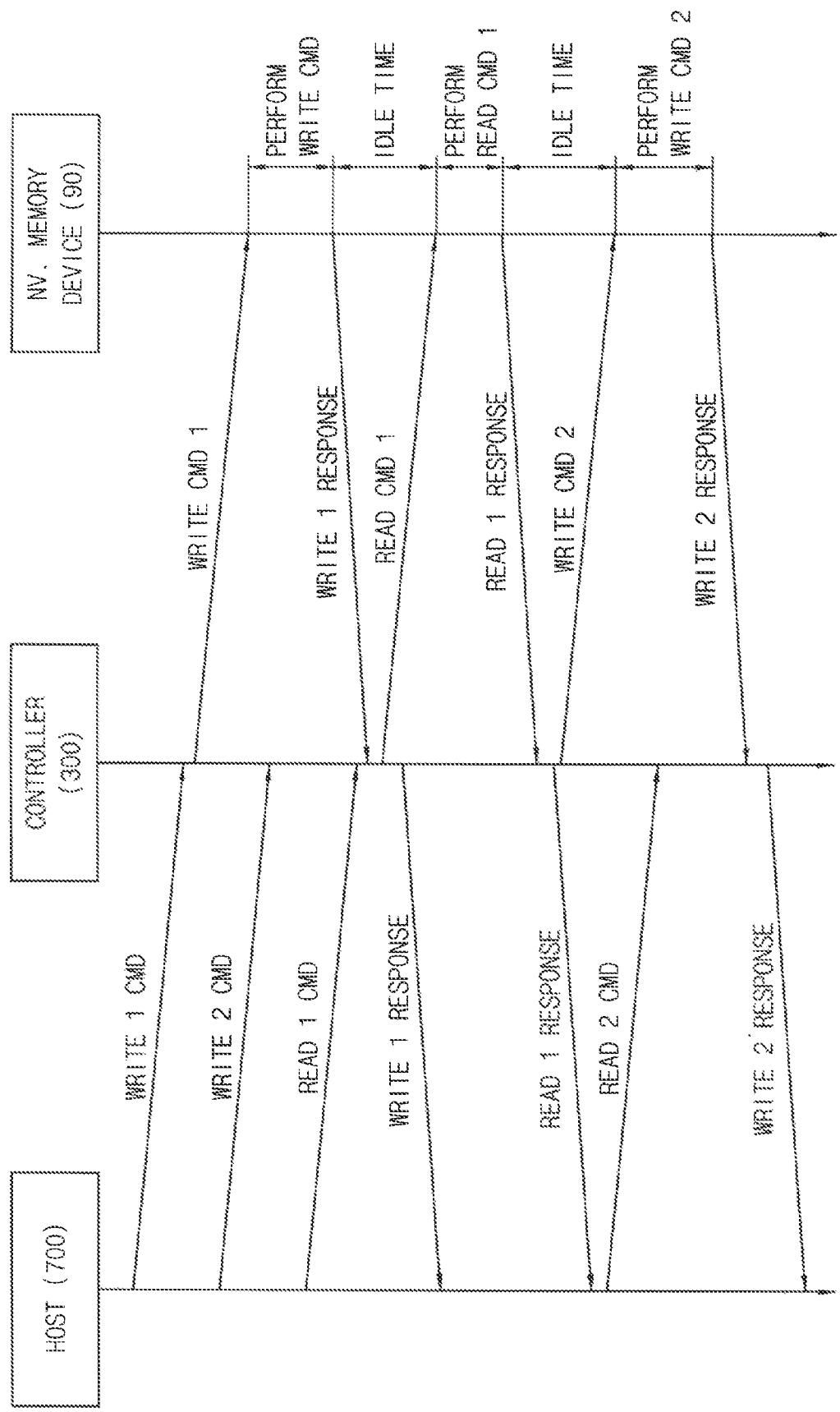
FIG. 4 illustrates a timing diagram corresponding to a comparative example including a conventional non-volatile memory device.
Figure 5:
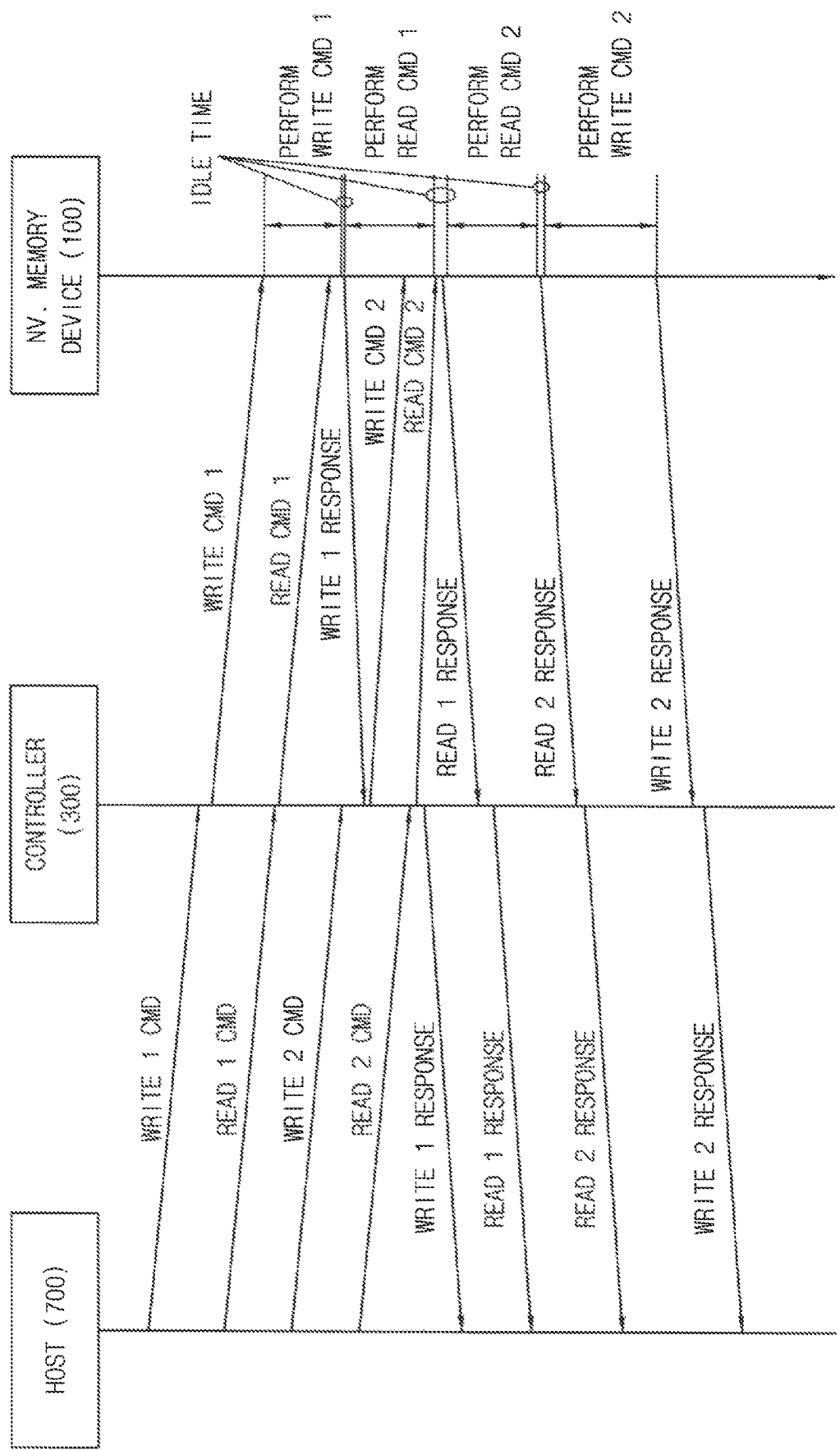
FIG. 5 illustrates a timing diagram corresponding to a non-volatile memory device according to an exemplary embodiment of the present inventive concept.

FIG. 4 illustrates a timing diagram corresponding to a comparative example including a conventional non-volatile memory device 90 in which operations requested by an external host 700 are executed in an order synchronous with the external host 700. The conventional non-volatile memory device 90 does not have an execution order adjustment function. FIG. 5 illustrates a timing diagram corresponding to exemplary embodiments of the inventive concept including the non-volatile memory device 100 in which operations requested by the external host 700 are executed in an order asynchronous with the external host 700. The non-volatile memory device 100 has an execution order adjustment function.

Referring to FIGS. 1, 2, 4 and 5, the non-volatile memory device 100 and the non-volatile memory system 500 including the non-volatile memory device 100 according to exemplary embodiments of the inventive concept utilize the queue 270 and the data buffer 210 to minimize (or reduce) the idle time. As a result, the efficiency of input/output data management is greatly improved according to exemplary embodiments.

An important difference between the conventional non-volatile memory device 90 shown in FIG. 4 and the non-volatile memory device 100 shown in FIG. 5 is that the execution order of the command operations requested by the host 700 through the controller 300 is adjusted for the non-volatile memory device 100 shown in FIG. 5, and is not adjusted for the conventional non-volatile memory device 90 shown in FIG. 4. For example, the non-volatile memory device 100 shown in FIG. 5 includes the queue 270 and the data buffer 210 as described above. The queue 270 and the data buffer 210 allow the execution order of the command operations requested by the host 700 through the controller 300 to be adjusted. In contrast, the non-volatile memory device 90 shown in FIG. 4 does not include the queue 270 and the data buffer 210, and thus, the execution order of the command operations requested by the host 700 through the controller 300 cannot be adjusted.

Referring to FIGS. 2 and 4, the host 700 may send various commands to the controller 300. FIG. 4 illustrates a case in which the host 700 sequentially sends a first program command WRITE1 CMD, a second program command WRITE2 CMD, a first read command READ1 CMD, and a second read command READ2 CMD to the controller 300. The controller 300 may load the commands sent by the host 700 into the queue 330. The core logic component 350 may adjust the execution order of the commands loaded in the queue 330 and transfer them to the non-volatile memory device 90.

In FIG. 4, the core logic component 350 may adjust the execution order of the first read command READ1 CMD to be ahead of the second program command WRITE2 CMD.

The non-volatile memory device 90 is not capable of performing a function that adjusts the command execution order. Therefore, the non-volatile memory device 90 executes the commands synchronously, that is, in the same order as the execution order provided by the controller 300. For example, after the controller 300 provides any one of the commands (e.g., a first program command WRITE CMD1) to the non-volatile memory device 90, the controller 300 cannot provide a new command (e.g., a first read command READ CMD 1) to the non-volatile memory device 90 until the non-volatile memory device 90 completes execution of the first program command WRITE CMD 1 and reports an execution result. Therefore, an idle time may occur in which the non-volatile memory device 90 cannot perform any command until the non-volatile memory device 90 reports the execution result of the received command to the controller 300 and receives a new command from the controller 300. For example, in FIG. 4 the time duration from a first time when the non-volatile memory device 90 reports the execution result of the first read command READ CMD1 to the controller 300 to a second time when the non-volatile memory device 90 receives a new command (e.g., the second program command WRITE CMD2) from the controller 300 corresponds to an idle time of the volatile memory device 90. As described above, the method and system in which the non-volatile memory device 90 executes the commands provided from the controller 300 synchronously may deteriorate system performance due to the latency caused by the frequent occurrence of the idle time.

With reference to FIGS. 2 and 5, in the non-volatile memory device 100 according to exemplary embodiments of the inventive concept, the commands provided by the controller 300 are stored in the queue 270, and the scheduler 290 intelligently adjusts the execution order of the commands to minimize (or reduce) the idle time. In executing the commands in the adjusted order, since a plurality of commands may be loaded in the queue 270, the non-volatile memory device 100 does not have to wait to receive a new command from the controller 300 after performing any one command operation, and may immediately start execution of the next command. Thus, the idle time can be minimized (or reduced) to a negligible level.

In addition, the commands may be loaded into the queue 270 in an order of, for example, the first program command WRITE CMD 1, the first read command READ CMD 1, a second program command WRITE CMD 2, and a second read command READ CMD 2, but the execution order of the commands may be adjusted by the scheduler 290 in the order that is best for reducing the idle time and efficiently performing data input/output management. FIG. 5 illustrates an adjusted execution order as such which is, for example, the first program command WRITE CMD 1, the first read command READ CMD 1, the second read command READ CMD 2, and the second program command WRITE CMD 2. The execution order of the commands may be intelligently adjusted so as to minimize (or reduce) the idle time based on the operation status of the non-volatile memory device 100, unlike the order provided by the controller 300. Accordingly, the non-volatile memory device 100 can minimize (or reduce) the latency due to idle time generation. As a result, the performance of the non-volatile memory system 500 can be greatly improved.

Figure 6:
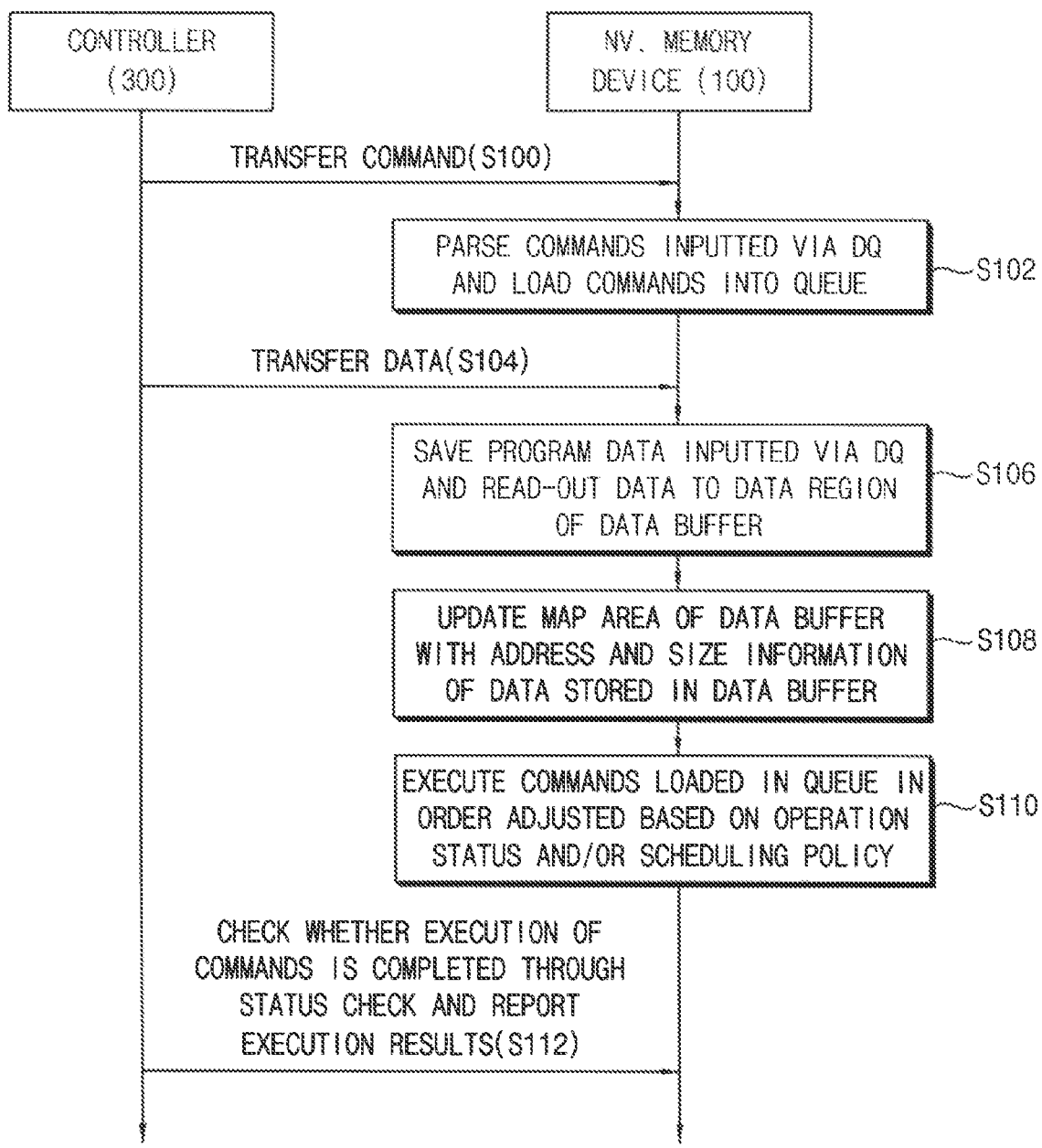
FIG. 6 is a flowchart schematically illustrating a procedure in which a non-volatile memory device according to exemplary embodiments of the present inventive concept performs commands received from an external controller (host).

FIG. 6 is a flowchart schematically illustrating a procedure in which the non-volatile memory device 100 executes the commands from the external controller (host) according to an exemplary embodiment of the inventive concept.

Referring to FIGS. 2 and 6, the controller 300 may provide commands (e.g., program, read, erase, etc.) to the non-volatile memory device 100 to perform an operation requested by the external host (S100).

The commands may be input through the DQ 132 of the input/output pad unit 130, and may be transferred to the command parsing unit 250. The command parsing unit 250 may parse the commands and sequentially load the commands into the queue 270 (S102).

The controller 300 may provide the program data necessary for executing the commands to the non-volatile memory device 100 (S104).

The program data may be input through the DQ 132 of the input/output pad unit 130 and stored in the data region of the data buffer 210 (S106).

The data buffer 210 may store the program data in the data area 210A, and also perform an update to reflect a list of the stored program data (e.g., information on the storage address, data amount, related operation, etc.) and information for managing validity of the program data in the map area 210B (S108).

The scheduler 290 may adjust the execution order of the commands stored in the queue 270 in consideration of factors such as, for example, the type of operation, the importance of the operation, etc., based on the internal operation status and/or a predetermined scheduling policy of the non-volatile memory device 100, and execute the commands in the adjusted execution order (S110).

The host (or the controller 300) may determine whether execution of the command operation is completed by checking the status of the non-volatile memory device 100. When it is determined that the command execution is completed through the status check, the non-volatile memory device 100 may report the command execution result to the host (or the controller 300) (S112).

Figure 7:
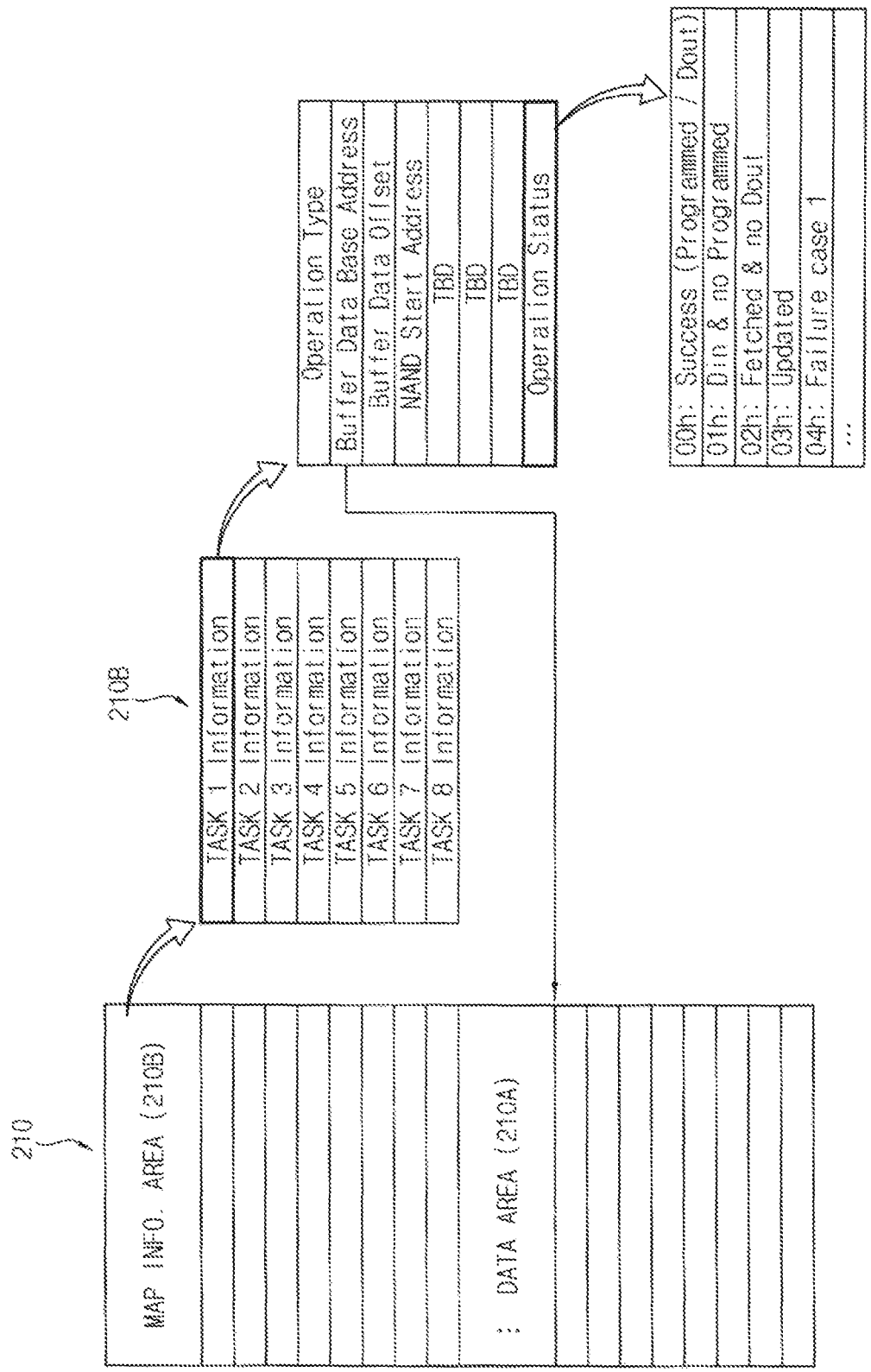
FIG. 7 is a diagram for describing a valid data mapping method in a data buffer provided in a non-volatile memory device according to exemplary embodiments of the present inventive concept.

Information about various tasks that the non-volatile memory device 100 performs in response to the command from the controller 300 may be stored in the map area 210B and managed and/or utilized. FIG. 7 is a diagram for describing a method of mapping valid data in the data buffer 210 related thereto according to an exemplary embodiment of the inventive concept.

Referring to FIG. 7, information (Task Information) on each task to be performed may be stored in the map area 210B. Each piece of Task Information may include, for example, information of an operation type, a buffer data base address, a buffer data offset, a NAND start address, an operation status, a "to be decided" (TBD) area, etc. The operation type indicates the type of operation to be performed (e.g., program, read, or erase), and the NAND start address indicates the write address of the provided program data in the non-volatile memory cell array 110 specified by the controller 300. These two pieces of information may be provided by the controller 300. The buffer data base address indicates the starting point address of the data area 210A in which the data related to the task is stored. The buffer data offset indicates the amount of data related to the task, and the operation status indicates the execution status of the task. These three pieces of information may be information generated by the non-volatile memory device 100 itself. The operation status may indicate the status of the task in various codes. For example, a code value 00h may indicate a status in which the write operation to the memory cell array 110 of the program data has been successfully completed (programmed) or a status in which the read-out data has been successfully transferred to the controller 300 (Dout). A code value 01h may indicates a status in which the program data is received from the controller 300 (Din) but has not yet been written to the memory cell array 110 (not programmed). A code value 02h may indicate a status in which data has been read from the non-volatile memory cell array 110 (fetched) but has not yet been output to the controller 300 (no Dout). A code value 03h may indicate a status in which the status information value of the first queue 270 has been updated to the first TSR 292. A code value 04h may indicate a status "Failure case 1" in which a failure has occurred when the task is executed. In addition to the illustrated example, the required task status may be further defined.

Figure 8:
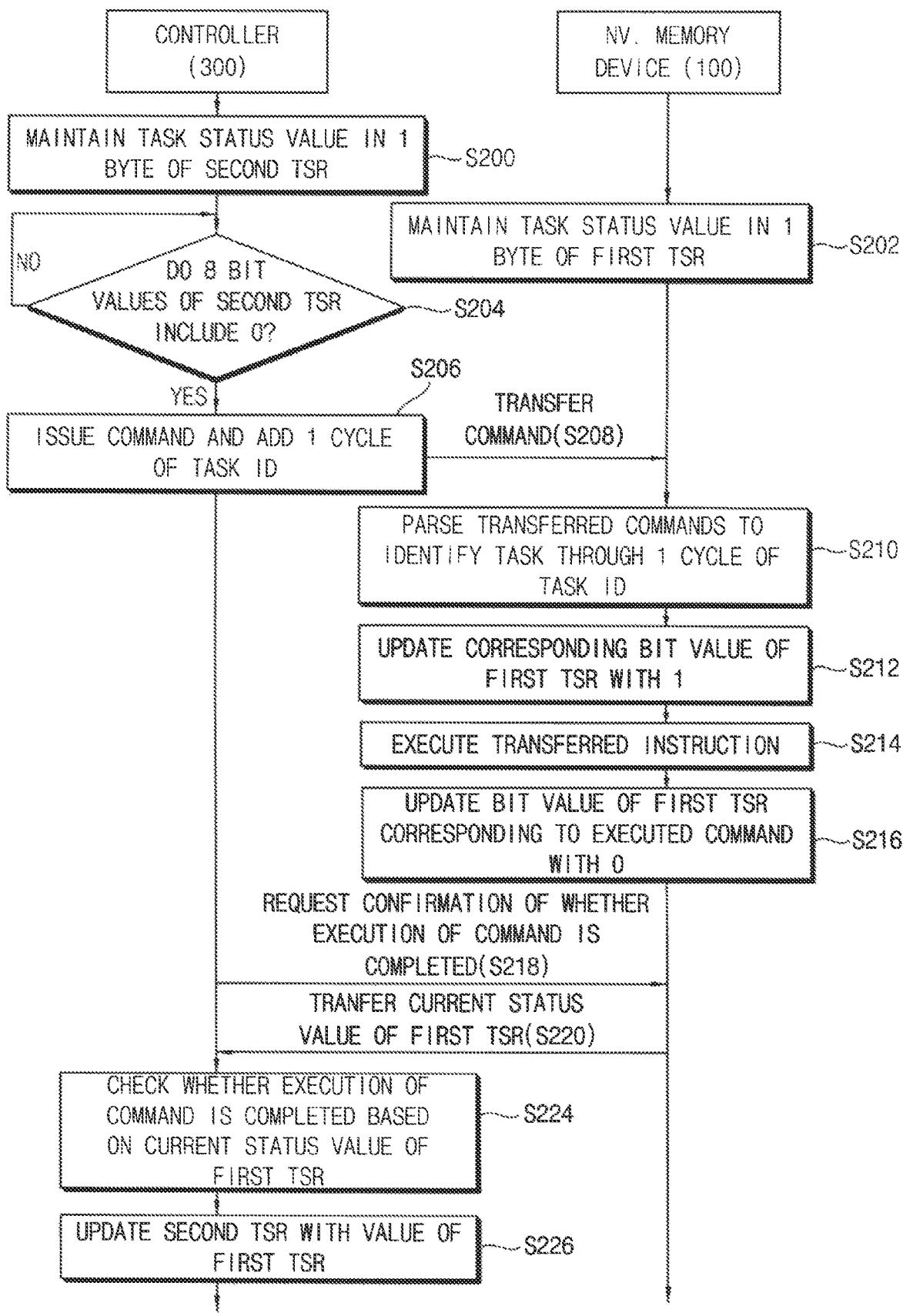
FIG. 8 is a flowchart for describing an interface protocol between an external controller (host) and a non-volatile memory device according to exemplary embodiments of the present inventive concept.
Figure 10:
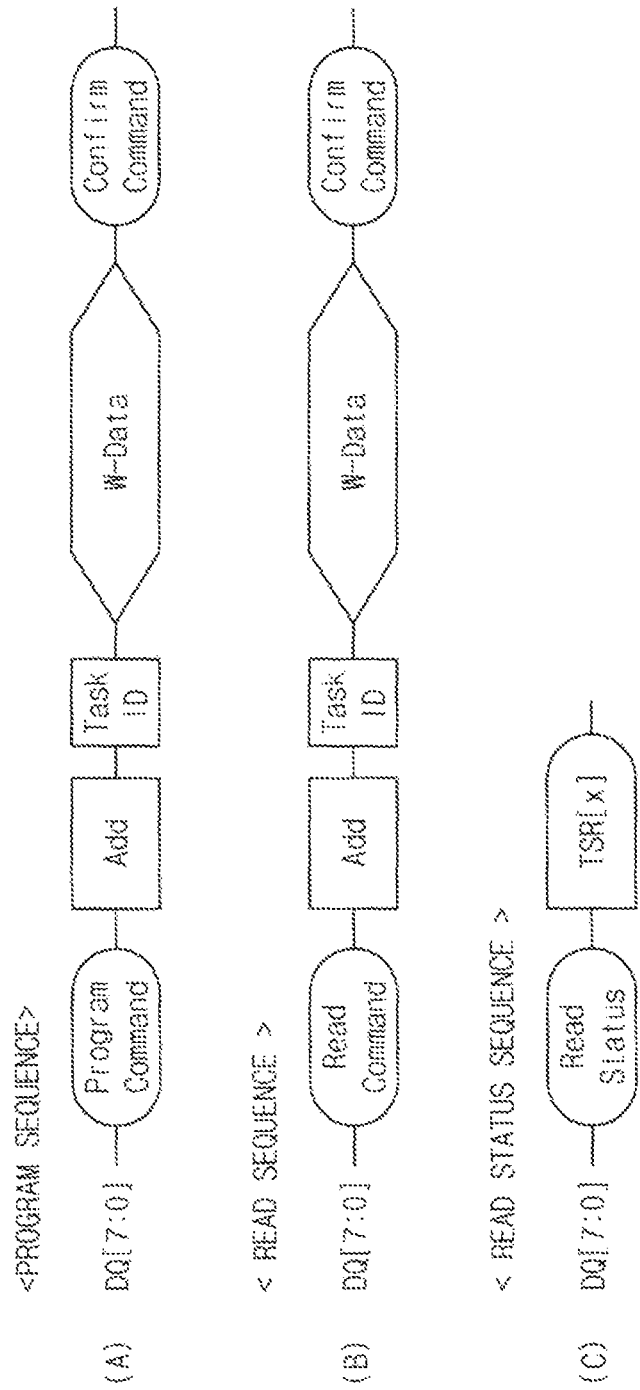
FIG. 10 illustrates a sequence of commands for an external controller (host) to transfer the commands to a non-volatile memory device and to confirm completion of execution, in accordance with an exemplary embodiment of the present inventive concept.

FIG. 8 is a flowchart illustrating a host interface protocol between the external controller 300 (host) and the non-volatile memory device 100 according to exemplary embodiments of the inventive concept. FIG. 9 illustrates first and second TSR tables 294 (Table (A)) and 354 (Table (B)) which represent status values stored in the first and second TSRs 292 and 352, respectively. FIG. 10 illustrates a command sequence for the external controller 300 (host) to transfer commands to the non-volatile memory device 100 and to confirm completion of execution of the commands in accordance with exemplary embodiments of the inventive concept.

The host interface protocol (or queuing protocol) will be described with reference to FIG. 2 and FIGS. 8 to 10.

Since the non-volatile memory device 100 may store a plurality of commands provided by the controller 300 in the queue 270 and execute them asynchronously with the controller 300, the operations of command and data transfer, request, and response between the external controller 300 (or host) and the non-volatile memory device 100 should be efficiently performed without causing confusion. Exemplary embodiments may utilize a host interface protocol or a queuing protocol for this purpose.

The non-volatile memory device 100 should be capable of distinguishing the commands from each other because it loads and executes a plurality of commands in the queue 270. To this end, a unique name tag, e.g., a unique task ID, may be added for each command. The commands requested by the host may be stored in the queue 330 of the controller 300 and then transferred to the queue 270 of the non-volatile memory device 100. According to an exemplary embodiment, the depth of the queues 270 and 300 may be 8-depth (DQ0-DQ7) per 1 byte cycle of task ID.

The status information of both queues 270 and 330 may be stored and managed so that the transfer of commands and the confirmation of completion of execution between the controller 300 and the non-volatile memory device 100 can be efficiently performed. To this end, according to an exemplary embodiment, the non-volatile memory device 100 and the controller 300 may include the first task status register (TSR) 292 and the second task status register (TSR) 352, respectively. The first TSR 292 and the second TSR 352 may store the status information values of the first queue 270 and the second queue 330, respectively. In exemplary embodiments, the first TSR 292 and the second TSR 352 may be replaced with any other type of temporary storage means.

The sizes of the first and second TSRs 292 and 352 may be determined in consideration of the sizes (depths) of the queues 270 and 330. For example, if the sizes of the queues 270 and 330 are 8-depth (DQ0-DQ7), the sizes of the first and second TSRs 292 and 352 may be set to 1 byte. If the depths of the queues 270 and 330 are increased or decreased, the sizes of the first and second TSRs 292 and 352 may be changed accordingly. The first and second TSR tables 294 and 354 shown in FIG. 9 assume that the sizes of the first and second TSRs 292 and 352 are 1 byte.

According to an exemplary embodiment, the first and second TSRs 292 and 352 may be provided in, for example, the scheduler 290 and the core logic component 350, respectively. Based on the status information values of the queues 270 and 330 stored in the first TSR 292 and the second TSR 352, it can be determined whether the execution of the commands is completed. The status information value of the first queue 270 stored in the first TSR 292 may be continuously updated as the execution of the commands stored therein is completed. The updated status information value in the first TSR 292 may be transferred to the controller 300 to be reflected on the second TSR 352. In this way, the controller 300 can check whether the commands requested by itself to the non-volatile memory device 100 are completed.

For example, referring to FIG. 8, the controller 300 and the non-volatile memory device 100 allocate 1 byte of the first TSR 292 and 1 byte of the second TSR 352, respectively, to manage the task status information values of the first queue 270 and the second queue 330 (S200 and S202).

The controller 300 may check the status to determine whether the command can be sent to the non-volatile memory device 100. To this end, the controller 300 may check whether the values of the status information stored in all of the bits of the second TSR 352 include 0 (S204). For example, in FIG. 9, since from among all of the 8-bit values stored in the second TSR 352 the value of the third storage element DQ2 of the first queue 270 is 0, the third storage element DQ2 is empty. In this state, the 8-bit values of the first TSR 292 may also be equal to the 8-bit values of the second TSR 352. In the status information values stored in the first and second TSRs 292 and 352, the status information value '0' may indicate the status that the storage element of the queue corresponding to its position is empty, whereas the status information value '1' may indicate the status that the storage element of the queue corresponding to its position is busy.

If there is a bit of which the value is 0 as a result of the check, the controller 300 may send a command to the non-volatile memory device 100. In this case, the controller 300 may issue a desired command (e.g., erase, program, or read command) while adding a 1 byte cycle of task ID to the issued command (S206). As a result, every issued command may have its own task ID so as to be identified. In the example shown in FIG. 9, the task ID may be issued with a value of, for example, '11011111'.

The controller 300 may store the issued commands in the queue 330 and transfer the commands to the non-volatile memory device 100 in the order designated by the core logic component 350 (S208). As shown in sequence (A) of FIG. 10, a program command sequence for requesting a program command may include, for example, a program command+a task ID, program data W-Data to be written, and a confirmation command for transmission completion. The 'program command+task ID' and the confirmation command may be sent to the command parsing unit 250, and the program data W-Data to be written may be transmitted to the data buffer 210.

The sequence of operations of the program commands may be performed as an atomic operation that is not separable from the controller 300 to the data buffer 210 of the non-volatile memory device 100. The non-volatile memory device 100 may independently execute the operation of programming to program the W-data from the data buffer 210 to the non-volatile memory cell array 110 regardless of the controller 300.

Similarly, as illustrated in sequence (B) of FIG. 10, a read command sequence for requesting a readout command may have a similar format. The sequence of operations of the read command may also be performed as an atomic operation that is not separable from the controller 300 to the data buffer 210 of the non-volatile memory device 100. The time at which the non-volatile memory device 100 will send the read-out data to the controller 300 may be determined depending on a predetermined priority or a method in which the controller 300 sends the command to the non-volatile memory device 100 one more time.

The command parsing unit 250 of the non-volatile memory device 100 may parse the command sequence to identify the task via the 1 byte cycle of task ID that follows the command (S210). The command parsing unit 250 may store the identified command in the corresponding position of the first queue 270 based on its task ID and update the corresponding bit of the first TSR 292 to 1 (S212). For example, in table (A) of FIG. 9, the status information value of the first TSR 292 corresponding to the third storage element DQ2 of the first queue 270 may be updated from 0 to 1.

In the non-volatile memory device 100, the commands loaded in the first queue 270 may be executed asynchronously with the controller according to the above-described method (S214).

When execution of a command is completed, the non-volatile memory device 100 may update the value of the corresponding bit of the first TSR 292 corresponding to the command to 0 (S216). This means that the storage element of the first queue 270 corresponding to the corresponding bit is empty. That is, the storage element is in a status in which it can accept a new command.

Operations S214 and S216 may be repeatedly performed, and the controller 300 may request that the non-volatile memory device 100 confirm whether the execution of the commands is completed (S218).

According to an exemplary embodiment, the confirmation request may be performed in a polling fashion that periodically sends an acknowledgment request to the non-volatile memory device 100. If a reception (Rx) line and a transmission (Tx) line between the controller 300 and the non-volatile memory device 100 are separate lines, the non-volatile memory device 100 may issue a confirmation to the controller 300 when the command execution is completed without requesting the controller 300 as a host.

According to an exemplary embodiment, the controller 300 may send a read status sequence to the non-volatile memory device 100 for a status check to determine whether the command is completed. Accordingly, the controller 300 may receive the value stored in the first TSR 292, that is, the status information value of the first queue 270 (completion of command execution). The read status sequence that the controller 300 may send to the non-volatile memory device 100 to confirm whether the command execution is completed may be configured, for example, in the form of 'Read Status+TSR[x]' as illustrated in sequence (C) of FIG. 10. The read status sequence has the meaning of requesting the non-volatile memory device 100 to send the status information value stored in the first TSR 292.

In response to the request, the non-volatile memory device 100 may send the value currently stored in the first TSR 292, e.g., the current status information value of the first queue 270, to the controller 300 (S220).

The controller 300 may check whether the commands stored in the first queue 270 have been completed based on the value currently stored in the first TSR 292 received from the non-volatile memory device 100 (S224). For example, if 0 is included in the 8-bit values received from the first TSR 292, it means that the command corresponding to the 0 value has been completed and the corresponding storage element of the first queue 270 is empty now.

The controller 300 may update the second TSR 352 with the current stored value of the first TSR 292 received from the non-volatile memory device 100 (S226). Through this process, the first TSR 292 and the second TSR 352 can maintain the same value. Thus, the controller 300 may accurately know the current status of the first queue 270 in the non-volatile memory device 100, that is, the completion status of the commands stored in the non-volatile memory device 100, in real time.

Since the non-volatile memory device 100 includes the data buffer 200, the non-volatile memory device 100 can support various additional operations including, for example, flushing and pre-fetching operations.

Figure 11:
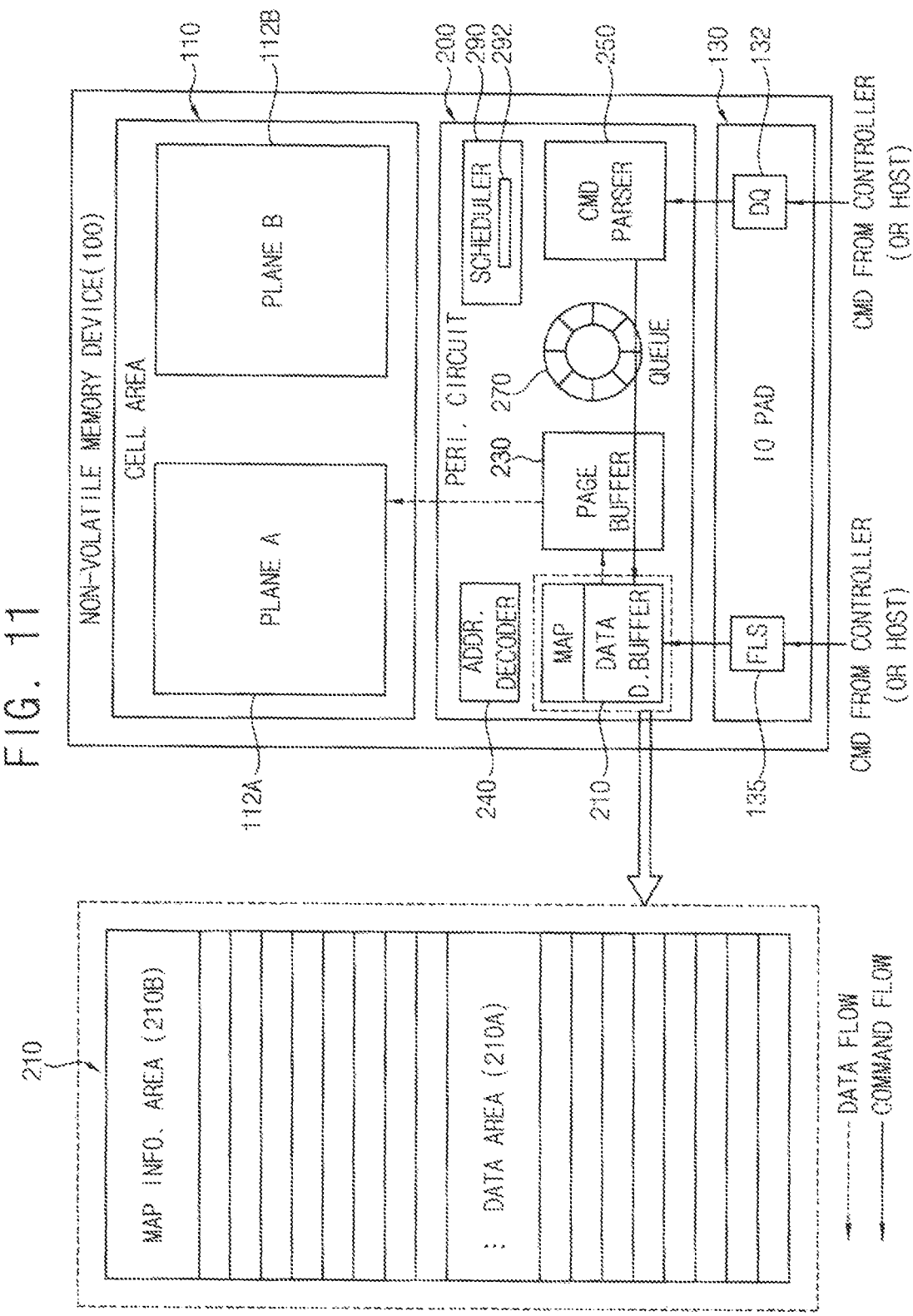
FIG. 11 is a diagram illustrating the flow of data and commands related to a flushing operation that may be performed in a non-volatile memory device according to an exemplary embodiment of the present inventive concept.

FIG. 11 illustrates the flow of data and commands related to a flushing operation that may be performed in the non-volatile memory device 100, in accordance with an exemplary embodiment of the inventive concept.

Referring to FIG. 11, in an exemplary scenario, the non-volatile memory device 100 receives program data sent by the controller 300 requesting a program operation, and temporarily stores the program data in the data buffer 210 without initially writing the program data in the non-volatile memory cell array 110. The program data may be critical data that is not allowed to be lost. The data buffer 210 may lose all data stored therein when the power is turned off. It may be safe to write the important data to the non-volatile memory cell array 110 immediately without allowing it to stay in the data buffer 210 for a long time.

The host 700 (or the controller 300) may issue a request to the non-volatile memory device 100 to perform the flushing operation when it is desired to write the important data to the non-volatile memory array 110 that is not allowed to be lost. In addition, even when a period of time during which the cached data stays in the data buffer 210 becomes more than a certain level, the flushing operation may also be requested.

According to an exemplary embodiment, a request for the flushing operation to be performed may be made in such a way that the controller 300 provides a flushing command via the DQ 132 of the input/output pad unit 130. A command for the flushing request may include an address of the non-volatile memory cell array 110. When a command for requesting the flushing is received by the data buffer 210 from the controller 300, the data buffer 210 of the non-volatile memory device 100 may execute forced-programming of the data temporarily stored in the data buffer 210 in the non-volatile memory cell array 110 from the address. The data matched with the address may be found based on the task information of the map area 210B. The host 700 (or the controller 300) may also instruct the non-volatile memory device 100 to flush the data temporarily stored in the page buffer 230 into the non-volatile memory cell array 110.

According to an exemplary embodiment, the flushing request may be made by a pin control, that is, in such a way that the input/output pad unit 130 is provided with a dedicated flushing pin 135 for requesting flushing, and the controller 300 may operate the flushing pin 135 to request flushing. Then, the flushing pin 135 may force all programming data temporarily stored in the data buffer 210 to be programmed in the non-volatile memory cell array 110.

According to an exemplary embodiment, the flushing request may be made by the core logic component 350 of the controller 300. Alternatively, a separate NAND manager logic unit may be provided in the controller 300 to make the flushing request.

In exemplary embodiments, the flush request command always has the highest priority. Thus, when the flush request command is received, the non-volatile memory device 100 may execute the flush request command immediately and before other commands.

Figure 12:
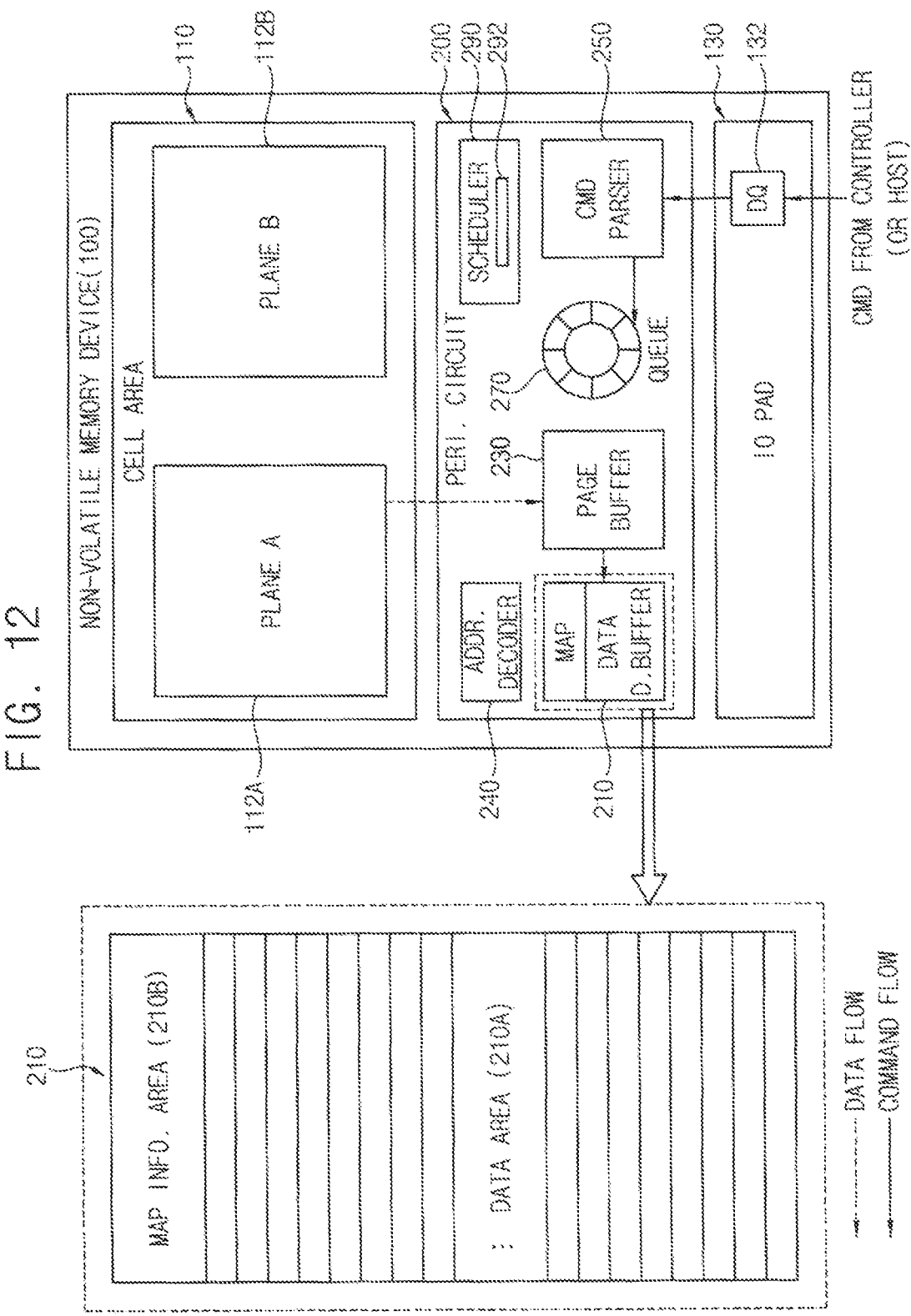
FIG. 12 is a diagram illustrating the flow of data and commands related to a pre-fetching operation that may be performed in a non-volatile memory device according to an exemplary embodiment of the present inventive concept.

FIG. 12 illustrates a flow of data and commands relating to a pre-fetch operation that may be performed in the non-volatile memory device 100, in accordance with an exemplary embodiment of the inventive concept.

Performance of the system may be improved by preliminarily reading the data stored in a section to be sequentially read out from the non-volatile memory cell array 110 and temporarily storing the readout data in the data buffer 210.

According to an exemplary embodiment, the pre-fetch operation may be executed by a command (request) from the host 700 (or the controller 300). The pre-fetch command may include information about the address and offset in the non-volatile memory cell array 110 (e.g., the amount of data to pre-fetch). If the controller 300 transmits the pre-fetch command to the non-volatile memory device 100, the command parsing unit 250 may parse the pre-fetch command to be stored in the queue 270. When executing the pre-fetch command, the data matched with the address to be pre-fetched may be read from the non-volatile memory cell array 110 and transferred to the data area 210A of the data buffer 210 through the page buffer 230.

According to an exemplary embodiment, the pre-fetch operation may be performed according to the self-determination operation of the non-volatile memory device 100. Here, a case in which the idle time is expected to be long, or a case in which as a program operation is being performed on any one plane 112A of the planes, a read operation to the other one plane 112B can be performed, etc., may be examples of the case in which the pre-fetch operation is performed according to the self-determination operation of the non-volatile memory device 100.

For example, according to an exemplary embodiment, the non-volatile memory system supports a pre-fetch operation that includes reading data stored in a sequential read section from among the data written in the non-volatile memory cell array 110 in advance, and storing the read data in the data buffer 210 according to a pre-fetch request issued by the controller 300 or according to a self-determination operation of the non-volatile memory device 100.

The pre-fetched data is stored in a large-capacity data buffer 210, and an efficient operation using the pre-fetched data can be performed. Generally, in the cell structure from the single-level cell (SLC) to the triple-level cell (TLC) in which the number of bits that can be stored per cell is 1 to 3 bits, the time T1 (referred to as DMA time) required for transferring read-out data in the page buffer 230 to the controller 300 through the DQ 132 may be longer than the time T2 (referred to as tR time) required for reading data from the non-volatile memory cell array 110 to be stored into the page buffer 230. However, in the case of a quad-level cell (QLC) structure capable of storing 4 bits per cell, or another cell structure capable of storing more bits than 4 bits in one cell, the tR time (T2) may be longer than the DMA time (T1). In this case, the pre-fetch function that pre-reads the data stored in the non-volatile memory cell array 110 may be useful.

Exemplary embodiments of the present inventive concept may be usefully applied to various devices and systems including the non-volatile memory device, and particularly may be applied to various devices such as, for example, computers, laptops, cellular phones, smartphones, MP3 players, personal digital assistants (PDAs), portable multi-media players, digital TVs, digital cameras, portable game consoles, navigation devices, wearable devices, Internet of Things (IoT) devices, virtual reality devices, augmented reality devices, etc.

As is traditional in the field of the inventive concept, exemplary embodiments are described, and illustrated in the drawings, in terms of functional blocks, units and/or components. Those skilled in the art will appreciate that these blocks, units and/or components are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

In exemplary embodiments of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A non-volatile memory device, comprising:
a non-volatile memory cell array configured to store data, wherein the non-volatile memory device executes an operation requested by a controller;
an input/output pad component configured to provide a path through which a command and data related to the operation requested by the controller are input to the non-volatile memory device, and through which a result of execution of the requested operation is output to the controller; and
a peripheral circuit configured to be loaded with a plurality of commands provided by the controller, to temporarily store program data provided by the controller to be written in the non-volatile memory cell array and data read from the non-volatile memory cell array, to adjust an execution order of the commands asynchronously with the controller to be different than an order in which the commands are provided by the controller, and to execute the commands in the adjusted execution order.

2. The non-volatile memory device of claim 1, wherein each of the commands provided by the controller includes a unique task ID, and the commands provided by the controller are distinguished from one another based on the unique task ID.

3. The non-volatile memory device of claim 1, wherein the non-volatile memory cell array comprises a vertical structure comprising a plurality of layers, and the peripheral circuit is arranged above or below the vertical structure.

4. The non-volatile memory device of claim 1, wherein the peripheral circuit comprises:
a page buffer configured to store the program data provided by the controller to be written in the non-volatile memory cell array and the data read from the non-volatile memory cell array;
a command parser configured to parse a command provided by the controller through the input/output pad component;
a queue configured to temporarily store the commands provided by the controller through the input/output pad component;
a data buffer configured to temporarily store the program data provided by the controller through the input/output pad component and transfer the program data to the page buffer, or to receive and temporarily store data read from the page buffer and transfer the read data to the controller through the input/output pad component to execute operations corresponding to the commands temporarily stored in the queue; and
a scheduler configured to adjust an execution order of the commands temporarily stored in the queue differently from an order provided by the controller,
wherein the execution order of the commands temporarily stored in the queue is adjusted based on an internal operation status and/or a predetermined scheduling policy of the non-volatile memory device, and the commands temporarily stored in the queue are executed in the adjusted execution order.

5. The non-volatile memory device of claim 4, wherein the data buffer comprises:
a data area configured to temporarily store the program data and the read data, and a map area configured to store a list of data stored in the data area and information for managing data validity.

6. The non-volatile memory device of claim 4, wherein the queue is a circular queue.

7. The non-volatile memory device of claim 4, wherein the peripheral circuit further comprises:
a task status register configured to store a status information value of the queue,
wherein the peripheral circuit is configured to update the status information value stored in the task status register upon completion of execution of the commands temporarily stored in the queue, and the controller is configured to confirm completion of the execution of the commands temporarily stored in the queue using the updated status information value.

8. A non-volatile memory system, comprising:
a non-volatile memory device; and
a controller configured to transmit a request to the non-volatile memory device to execute an operation,
wherein the non-volatile memory device comprises:
a non-volatile memory cell array configured to store data;
an input/output pad component configured to provide a path through which a command and data related to the operation requested by the controller are input to the non-volatile memory device, and through which a result of execution of the requested operation is output to the controller; and
a peripheral circuit configured to be loaded with a plurality of commands provided by the controller, to temporarily store program data provided by the controller to be written in the non-volatile memory cell array and data read from the non-volatile memory cell array, to adjust an execution order of the commands asynchronously with the controller to be different than an order in which the commands are provided by the controller, and to execute the commands in the adjusted execution order.

9. The non-volatile memory system of claim 8, wherein the peripheral circuit comprises:
a page buffer configured to store the program data provided by the controller to be written in the non-volatile memory cell array and the data read from the non-volatile memory cell array;
a command parser configured to parse a command provided by the controller through the input/output pad component;
a first queue configured to temporarily store the commands provided by the controller through the input/output pad component;
a first data buffer configured to temporarily store the program data provided by the controller through the input/output pad component and transfer the program data to the page buffer, or to receive and temporarily store data read from the page buffer and transfer the data read from the page buffer to the controller through the input/output pad component to execute operations corresponding to the commands temporarily stored in the first queue; and
a scheduler configured to adjust an execution order of the commands temporarily stored in the first queue differently from an order provided by the controller,
wherein the execution order of the commands temporarily stored in the first queue is adjusted based on an internal operation status and/or a predetermined scheduling policy of the non-volatile memory device, and the commands temporarily stored in the first queue are executed in the adjusted execution order.

10. The non-volatile memory system of claim 9, wherein when the controller requests a flushing operation to be performed by issuing a command or pin control, the non-volatile memory device performs the flushing operation by forcibly programming specified data from among the data temporarily stored in the first data buffer at a designated position of the non-volatile memory cell array.

11. The non-volatile memory system of claim 9, wherein the non-volatile memory system supports a pre-fetch operation comprising reading data stored in a sequential read section from among the data written in the non-volatile memory cell array in advance, and storing the read data in the first data buffer according to a pre-fetch request issued by the controller or according to a self-determination operation of the non-volatile memory device.

12. The non-volatile memory system of claim 9, wherein the controller comprises:
a second data buffer configured to temporarily store at least one of the program data to be written in the non-volatile memory cell array and the read data transferred from the non-volatile memory device, wherein the program data is requested to be written in the non-volatile memory cell array by an external host;

a second queue configured to temporarily store the commands provided by the controller to the non-volatile memory device, wherein the commands provided by the controller to the non-volatile memory device are first provided to the controller by the external host; and a core logic component configured to adjust an order of transferring the commands temporarily stored in the second queue, and transfer the commands stored in the second queue in an adjusted order to the non-volatile memory device.

13. The non-volatile memory system of claim 12,
wherein the non-volatile memory device comprises a first task status register, and the controller comprises a second task status register,
wherein the first and second task status registers are configured to store status information values of the first queue and the second queue, respectively,
wherein a first status information value stored in the first task status register is updated upon completion of execution of the commands temporarily stored in the first queue, and the controller receives an updated first status information value and updates the second task status register to confirm completion of execution of a corresponding command.

14. The non-volatile memory system of claim 8, wherein the controller adds a unique task ID to each command provided by the controller and transmits the each command assigned with the unique task ID to the non-volatile memory device, wherein the unique task ID distinguishes the commands provided by the controller from one another.

15. A method of executing an operation in a non-volatile memory device, comprising:
parsing a command provided by a controller through an input/output pad component of the non-volatile memory device,
wherein the non-volatile memory device comprises a non-volatile memory cell array and a peripheral circuit,
wherein the peripheral circuit comprises a queue, a data buffer, and a command parser;
loading the parsed command into the queue;
temporarily storing at least one of program data provided by the controller through the input/output pad component, and data read from the non-volatile memory cell array, in a data area of the data buffer;
updating a map area of the data buffer with information relating to data stored in the data buffer;
adjusting an execution order of a plurality of commands loaded to the queue asynchronously with the controller based on an internal operation status and/or a predetermined scheduling policy of the non-volatile memory device; and
executing the commands loaded to the queue in the adjusted execution order.

16. The method of claim 15, further comprising:
performing a flushing operation comprising forcibly programming specified data from among the data temporarily stored in the data buffer to a designated position in the non-volatile memory cell array in response to a flushing request from the controller,
wherein the flushing operation has a highest priority in the non-volatile memory device.

17. The method of claim 15, further comprising:
performing a pre-fetch operation comprising reading data stored in a sequential read section from among the data written in the non-volatile memory cell array in advance, and storing the read data in the data buffer, in response to a pre-fetch request issued by the controller or according to a self-determination operation of the non-volatile memory device.

18. The method of claim 15, wherein the controller adds a unique task ID to each command and transmits the each command assigned with the unique task ID to the non-volatile memory device, wherein the unique task ID distinguishes the commands from one another.

19. The method of claim 15, further comprising:
managing task status information by the non-volatile memory device, wherein the task status information indicates whether execution of each of the commands loaded in the queue is completed,
wherein the controller confirms whether the execution of each of the commands is completed by checking the task status information managed by the non-volatile memory device.

20. The method of claim 19, wherein maintaining the task status information comprises:
storing a status information value of the queue in a task status register disposed in the peripheral circuit;
updating the status information value stored in the task status register, by the peripheral circuit, upon completion of execution of the commands loaded to the queue; and
confirming completion of the execution of the commands loaded to the queue, by the controller, using the updated status information value.

* * * * *